United States Patent
Liu et al.

(10) Patent No.: US 7,387,969 B2
(45) Date of Patent: Jun. 17, 2008

(54) TOP PATTERNED HARDMASK AND METHOD FOR PATTERNING

(75) Inventors: George Liu, Hsinchu (TW); Vencent Chang, Jhubei County (TW); Norman Chen, Hsin-chu (TW); Yao-Ching Ku, Hsin Chu (TW); Chin-Hsiang Lin, Hsin-chu (TW); Kuei Shun Chen, Hsin-chiu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 368 days.

(21) Appl. No.: 11/084,495

(22) Filed: Mar. 18, 2005

(65) Prior Publication Data
US 2006/0211254 A1    Sep. 21, 2006

(51) Int. Cl.
*H01L 21/302* (2006.01)
(52) U.S. Cl. .................. 438/717; 438/736; 430/269; 430/311; 430/330

(58) Field of Classification Search ............... 438/717, 438/736; 430/5, 269, 311, 330
See application file for complete search history.

(56) References Cited

U.S. PATENT DOCUMENTS

| | | | |
|---|---|---|---|
| 6,184,041 B1 * | 2/2001 | Furukawa et al. | 430/396 |
| 2002/0195419 A1 * | 12/2002 | Pavelchek | 216/16 |
| 2003/0193740 A1 * | 10/2003 | Kruger et al. | 360/125 |
| 2006/0246377 A1 * | 11/2006 | Yamato et al. | 430/311 |

* cited by examiner

*Primary Examiner*—Carl Whitehead, Jr.
*Assistant Examiner*—Colleen E Rodgers
(74) *Attorney, Agent, or Firm*—Thomas, Kayden, Horstemeyer & Risley

(57) ABSTRACT

A patterned hardmask and method for forming the same, the method including providing a substrate comprising an overlying resist sensitive to activating radiation; forming an overlying hardmask insensitive to the activating radiation; exposing the resist through the hardmask to the activating radiation; baking the resist and the hardmask; and, developing the hardmask and resist to form a patterned resist and patterned hardmask.

14 Claims, 3 Drawing Sheets

TOP PATTERNED HARDMASK AND METHOD FOR PATTERNING

FIELD OF THE INVENTION

This invention generally relates to resist patterning techniques in integrated circuit semiconductor device manufacturing processes and more particularly to an improved patterned uppermost hardmask and method for patterning the same to improve a lithographic process.

BACKGROUND OF THE INVENTION

One of the limiting factors in the continuing evolution toward smaller device semiconductor feature size and higher density has been the stringent requirements placed on photolithographic processes as feature sizes have decreased. Various proposals for improving feature resolution having included schemes for reducing a resist layer thickness.

Another limiting factor in manufacturing features with smaller feature sizes is the accuracy of etching and an etching resistance of an etching mask to prevent enlargement of an opening when attempting an anisotropic dry etching process. Prior art processes have generally formed an inorganic hardmask over a substrate followed by forming and patterning an overlying resist layer. The hardmask is then separately etched through a thickness according to the patterned resist mask prior to etching the substrate.

Another problem with conventional photoresists is that photoresist materials are frequently susceptible to chemical change by small amounts of chemical contaminants. For example, in immersion lithography, the photoresist may be contaminated by a immersion solution, leading to alteration of a resist profile or etching resistance.

There is therefore a continuing need for improved lithographic processes and materials in the integrated circuit manufacturing art.

It is an object of the present invention to provide an improved lithographic patterning process including an improved hardmask and method for patterning the same.

SUMMARY OF THE INVENTION

To achieve the foregoing and other objects, and in accordance with the purposes of the present invention, as embodied and broadly described herein, the present invention provides a patterned hardmask and method for forming the same, to improve a lithographic process.

In a first embodiment, the method includes providing a substrate comprising an overlying resist sensitive to activating radiation; forming an overlying hardmask insensitive to the activating radiation; exposing the resist through the hardmask to the activating radiation; baking the resist and the hardmask; and, developing the hardmask and resist to form a patterned resist and patterned hardmask.

These and other embodiments, aspects and features of the invention will be better understood from a detailed description of the preferred embodiments of the invention which are further described below in conjunction with the accompanying Figures.

DETAILED DESCRIPTION OF THE PREFERRED EMBODIMENTS

Although the present invention is explained with respect to, and particularly advantageous for, the formation of conductive interconnect lines in a multi-level integrated circuit semiconductor device, particularly where characteristic (critical) dimensions of semiconductor devices are less than or equal to about 0.15 microns, it will be appreciated that the method of the present invention may be used in any lithographic patterning process in an integrated circuit manufacturing process.

Figure 1A:
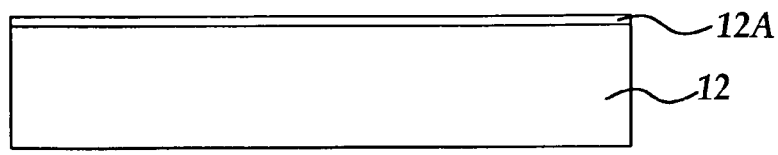
FIGS. 1A-1I are cross sectional views of an exemplary top hardmask pattern at steps in manufacturing according to an embodiment of the present invention.

Referring to FIG. 1A is shown a substrate 12. It will be appreciated that the substrate may be any type of substrate including a dielectric layer, a semiconductor or a conductive layer. In an exemplary embodiment, an optional bottom anti-reflectance coating (ARC) layer 12A is formed over the substrate 12. The ARC layer 12A may be an organic or inorganic material.

Figure 1B:
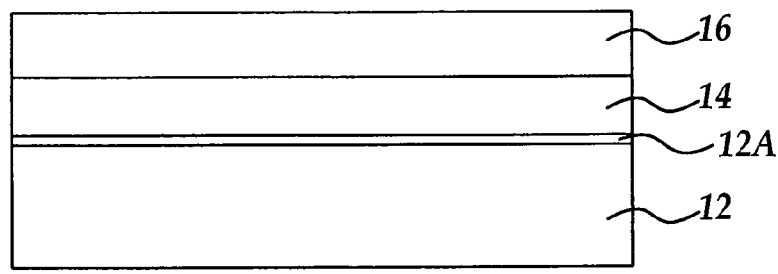

Referring to FIG. 1B, a photoresist layer 14 is then formed by conventional processes over the ARC layer 12A. The photoresist layer 14 is preferably a chemically amplified (CA) photoresist including a photoacid generator (PAG) which generates an acid upon exposure to an activating wavelength of radiation and subsequent baking. The activating radiation may be ultraviolet (UV), deep UV (DUV) (less than 245 nm), including sources KrF (248 nm) or ArF (193 nm), as well as shorter wavelength radiation such as x-ray irradiation. It will be appreciated that there are wide variety of commercially available photoresists including PAG's that are known in the art. For example the PAG may include triarylsulfonium salts, diaryliodonium salts, sulfonates or mixtures thereof.

In operation, upon absorption of a photon of activating radiation of an appropriate energy (wavelength), an acid is generated in the exposed portion of the photoresist and activated following a subsequent baking step. During a subsequent heating (baking) step the acid is activated (e.g., protecting group removed) and a series of catalytic chemical reactions (e.g., chemical bond cleavage and acid regeneration) are initiated to make the exposed portion of the photoresist more soluble in an appropriate developing process. Following application of the photoresist to the substrate surface, e.g., by a spin-on process, the photoresist may optionally undergo a first soft bake process, e.g., from about 60° C. to about 150° C. to drive off solvent and impart dimensional stability to the photoresist.

Still referring to FIG. 1B, prior to exposing the photoresist layer to activating radiation, for example through a photomask (reticle), a hardmask material layer 16, preferably transparent and insensitive to activating radiation, is formed (e.g., by a spin on process) on the photoresist layer 14. The hardmask material layer preferably includes an acid sensitive chemical group subject to cleavage when reacted with an acid (acid-cleavable). For example, the hardmask layer is a spin-on polymer including cross-linking groups subject to cleavage when reacted with acid (acid-cleavable). For example, ester groups are subject to acid attack and cleavage between an oxygen and carbon bond. The hardmask material layer may optionally include silicon or other metal, more preferably silicon, to increase an etching resistance compared to the photoresist layer 14. The hardmask material layer 16 preferably is transparent to activating radiation used in the photoresist exposure process, but preferably is substantially insensitive to the activating radiation (i.e., does not have a PAG).

For example, exemplary hardmask materials include silsesquioxanes (SSQ), including alkyl substituents, such as methyl silsesquioxane (MSQ). Other exemplary hardmask materials, preferably with an increased etching resistance compared to the underlying photoresist layer 14, may include polymeric organic materials with cycloalkane and/or cycloalkene groups including cycloesters and/or cycloethers. In addition, linear cross linking ester and/or ether groups are suitably included in the hardmask material. For example, another suitable hardmask material includes an alternating co-polymer of vinyl ether-maleic anhydride (VEMA).

The above exemplary hardmask materials preferably include an acid cleavable group, which upon reaction with an acid, cause chemical bond breaking (cleavage) and thereby render the hardmask material removable (soluble) in a developing solution. In addition, the preferred hardmask materials are substantially resistant to intermixing with the photoresist (image) layer 14 and form a substantially defined interface with the underlying photoresist layer. For example, the hardmask material is preferably hydrophobic when initially formed over the photoresist layer 14, which may be hydrophilic. In addition, the index of refraction (n) and dielectric constant (k) of the hardmask material are preferably adjustable, for example by adding other metal or semiconductor additives, or by a post-deposition thermal or radiation treatment process. The hardmask layer 16 may be formed having an index of refraction (n) from about 1 to about 2.5 and a dielectric constant (k) of about 0 to about 0.8. The hardmask layer 16 may be formed having a thickness of from about 10 Angstroms to about 5000 Angstroms.

Figure 1C:
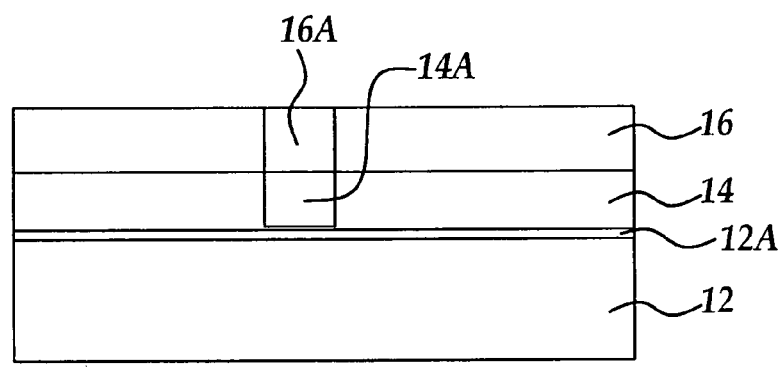

Referring to FIG. 1C, an area of the hardmask layer e.g., 16A, is illuminated with activating radiation through a photomask (not shown). The activating radiation is transmitted through the substantially transparent hardmask layer portion 16A to illuminate the underlying photoresist layer portion e.g., 14A, and photoacid generator in the photoresist is activated by the exposure including a subsequent baking process.

Following exposure of the photoresist layer portion 14A through the hardmask layer portion 16A to the activating radiation, the process wafer including the photoresist layer and hardmask layer is subjected to a conventional post-exposure bake (PEB) process. While the optimal temperature of the PEB process will depend on the type of photoresist used and the diffusion rate of the photogenerated acid in both the photoresist layer and the hardmask layer, temperatures of from about 80° C. to about 140° C., more preferably about 90° C. to about 120° C. may be suitably used. Preferably, the PEB process is carried out for a period of time sufficient to allow the photo-generated acid produced in the exposed portion e.g., 14A of the photoresist layer to diffuse upward, into, and through a thickness of the overlying hardmask layer portion 16A. The photo-generated acid preferably reacts with the hardmask layer material in portion 16A to cleave an acid cleavable chemical group. For example, the photo-generated acid may react with ester or ether containing cross-linking groups in the hardmask material to cleave such groups (break apart chemical bonds), thereby rendering the reacted portion of the hardmask material, e.g., 16A removable (soluble) in a subsequent developing process. It is noted that reaction of the hardmask material portion 16A with the diffused photo-generated acid preferably changes the hardmask layer portion 16A from hydrophobic to hydrophilic, thus allow a subsequent immersion development process.

Figure 1D:
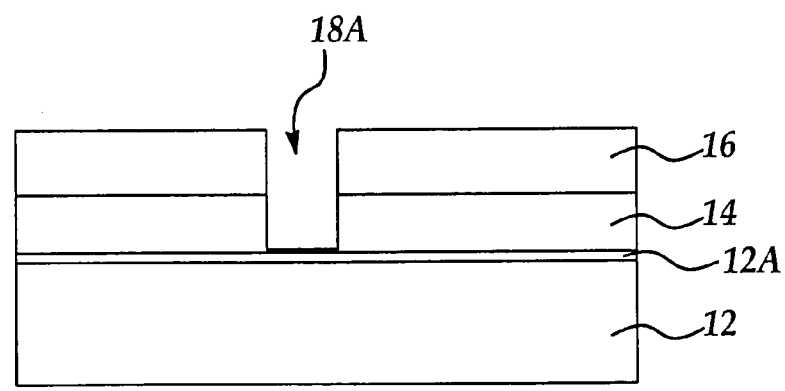

Referring to FIG. 1D, a conventional development process, such as immersion in a developer solution of tetra methyl ammonium hydroxide (TMAH), is then carried out to remove both the photo-generated acid reacted portion of the hardmask (top) layer 16A and the underlying activating radiation exposed portion of the photoresist (image) layer 14A to form a patterned opening e.g., 18A. It will be appreciated that other types of development processes such as a puddle development or puddle/spin process may be used as well.

Figure 1E:
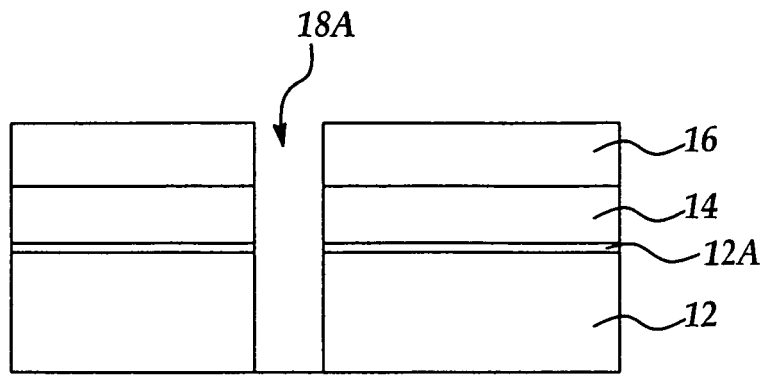

Referring to FIG. 1E, subsequent conventional processes are then carried out, for example carrying out a plasma etching process to anisotropically etch through optional underlying ARC layer e.g., 12A, preferably an inorganic material, and optionally, the substrate 12 (depending on the feature being formed), according to the patterned hardmask (top) layer 16 and patterned image layer 14, to extend opening 18A into the substrate 12. In the exemplary embodiment shown, the substrate 12 may be a dielectric insulating layer and is etched through a thickness portion to form a single damascene opening for subsequent filling with a conductive material, e.g., a metal such as aluminum, copper, tungsten or alloys thereof to form a conductive interconnect feature.

Figure 1F:
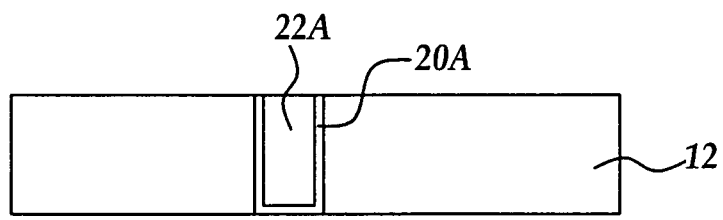

Referring to FIG. 1F, conventional processes such removal of the hardmask layer 16 and underlying photoresist layer 14 by ashing and/or wet stripping process may first be undertaken followed by conventional metal filling processes, such as barrier layer e.g., 20A formation followed by metal deposition and CMP to form metal layer portion 22A. It will be appreciated that the metal interconnect may be a dual damascene interconnect formed by conventional processes.

Figure 1G:
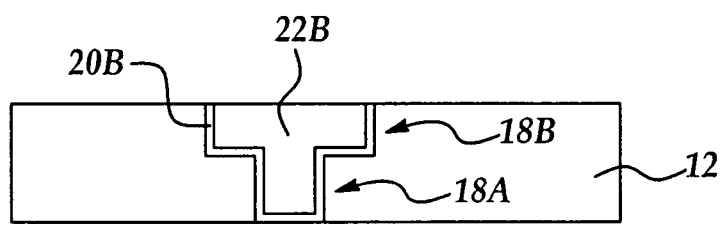

Referring to FIG. 1G, for example, a second exposure and development patterning process followed by etching, as previously outlined for formation of the single damascene opening (e.g., via opening) may be carried out to form an upper trench line portion e.g., 18B, overlying and encompassing the via opening e.g., 18A, followed by barrier layer 20B formation, conductive filling 22B formation, and CMP as before, to form a dual damascene feature.

Figure 1H:
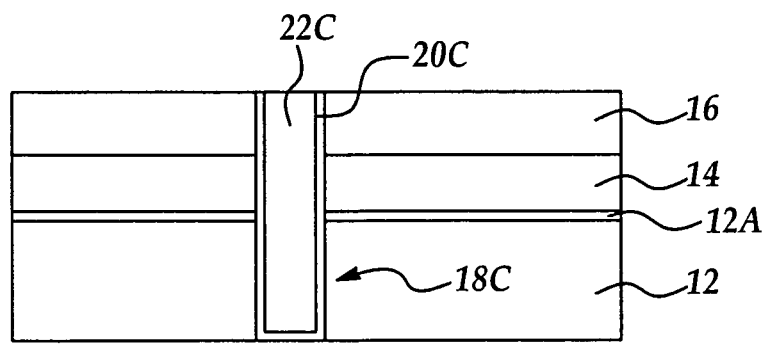

Referring to FIG. 1H, in another embodiment, the photoresist layer 14 and hardmask layer 16 may be left in place, the hardmask layer forming a dielectric insulator portion of a dielectric insulating stack, with a barrier or liner layer e.g., 20C being formed to line the opening e.g., 18C prior to backfilling with a conductive material, for example, formation of a metal seed layer followed by a low temperature electro-chemical deposition (ECD) process to form a barrier layer and/or a conductive filling layer 22C, followed by a CMP process with the hardmask layer 16 functioning as a CMP stop. Thus the hardmask layer 16 may be left in place to form a dielectric insulator layer in a multi-layer semiconductor device.

Figure 1I:
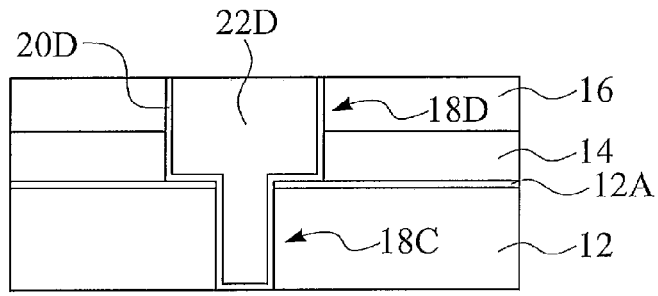

Referring to FIG. 1I, it will also be appreciated that a second exposure and development patterning process similar to the first exposure and development process outlined above, followed by etching, may be undertaken following formation of a single damascene opening (e.g., via opening) and prior to formation of a barrier layer and metal filling, to form an upper trench line portion e.g., 18D, overlying and encompassing the via portion, e.g., 18C, to form a dual damascene opening. Similar processes as previously outlines, such as barrier layer e.g., 20D formation and conductive material filling 22D formation followed by CMP may then be carried out to form a dual damascene interconnect feature.

Figure 2:
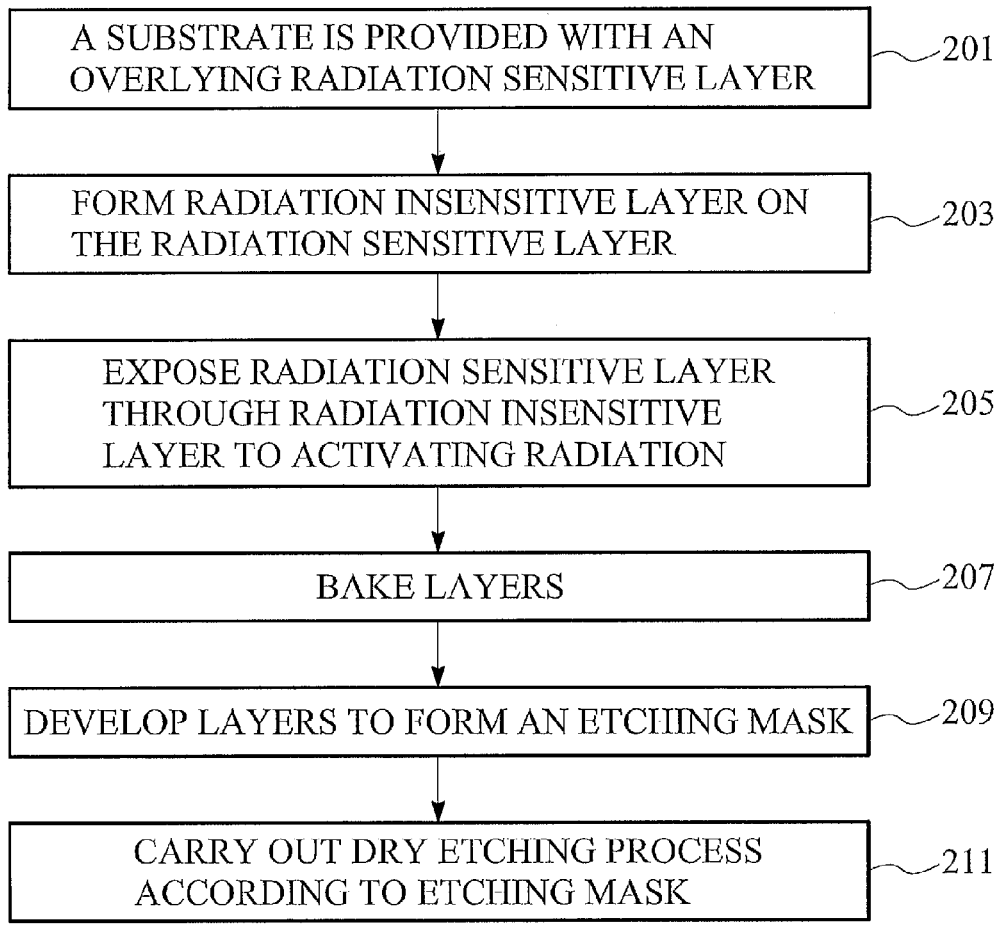
FIG. 2 is a process flow diagram including several embodiments of the present invention.

Referring to FIG. 2, is shown a process flow diagram including several embodiments of the present invention. In process 201, a substrate including an overlying radiation sensitive layer including a photo-acid generator is provided. In process 203, a radiation insensitive layer including an acid cleavable chemical group is formed on the radiation sensitive layer. In process 205, the radiation sensitive layer is exposed with activating light through the radiation insensitive layer layer. In process 207, the radiation sensitive layer is heated in a baking process to diffuse the photo-generated acid from the photoresist layer into an overlying portion of the radiation insensitive layer to react with the acid cleavable group. In process 209, the radiation insensitive layer and the radiation sensitive layer are developed to form an etching mask. In process 211, a dry etching process according to the etching mask is carried out to form an integrated circuit feature.

Thus, according to the present invention a top patterned hardmask and method for forming the same has been presented for improving a lithographic process. Advantageously, the same lithographic tools as are now in use by prior art lithographic methods may be used. In addition, the method has the advantage of preventing contamination of the resist by environmental contaminants thereby avoiding undesired changes in the photoresist. Moreover, the hardmask has the added advantage of reducing environmental contamination by volatization of small molecules from the resist material. More importantly, that hardmask layer improves an immersion development process by limiting diffusion of the developer into the resist at undesired portions, thereby improving development profiles and critical dimensions. In addition, the upper hardmask improves a subsequent dry etching process by increasing a process margin.

The preferred embodiments, aspects, and features of the invention having been described, it will be apparent to those skilled in the art that numerous variations, modifications, and substitutions may be made without departing from the spirit of the invention as disclosed and further claimed below.

What is claimed is:

1. A method for forming a patterned hardmask comprising the steps of:
   providing a substrate comprising an overlying resist sensitive to activating radiation;
   forming an overlying hardmask insensitive to the activating radiation;
   exposing the resist through the hardmask to the activating radiation;
   baking the resist and the hardmask; and,
   developing the hardmask and resist to form a patterned resist and patterned hardmask.

2. The method of claim 1, wherein the resist comprises a photo-generated acid formed in the steps of exposing or baking.

3. The method of claim 1, wherein the hardmask comprises a chemical bond cleavable by an acid.

4. The method of claim 1, wherein the hardmask comprises a chemical group selected from the group consisting of cyclo-alkenes, cyclo-esters, and cyclo-ethers.

5. The method of claim 1, wherein the hardmask comprises a material selected from the group consisting of silsesquioxanes, methyl silsesquioxane, and vinyl ether-maleic anhydride.

6. The method of claim 1, wherein the hardmask comprises a mixture of organic and inorganic material.

7. The method of claim 1, wherein the step of exposing comprises immersion exposure.

8. The method of claim 1, wherein the hardmask is nonreactive in a immersion liquid.

9. The method of claim 1, further comprising etching an opening through a thickness portion of the substrate according to the patterned resist and patterned hardmask.

10. The method of claim 1, further comprising forming a conductive interconnect comprising the opening following removal of the hardmask and resist.

11. A method for forming a pattern comprising the steps of:
    providing a substrate comprising an overlying radiation sensitive layer;
    forming a radiation insensitive layer on the radiation sensitive layer;
    exposing the radiation sensitive layer through the radiation insensitive layer to activating radiation by immersion;
    developing the radiation insensitive and the radiation sensitive layers to form an etching mask; and,
    etching through a thickness of the substrate according to the etching mask.

12. The method of claim 11, wherein the radiation insensitive layer is nonreactive in a immersion liquid.

13. The method of claim 11, wherein the radiation insensitive layer comprises a chemical bond cleavable by an acid.

14. The method of claim 11 further comprising, between said exposing and said developing step, the step of heating the radiation insensitive and the radiation sensitive layers.

\* \* \* \* \*